(12) United States Patent
Payne

(10) Patent No.: US 9,710,576 B2
(45) Date of Patent: *Jul. 18, 2017

(54) CROSS-DIPOLE ANTENNA CONFIGURATIONS

(71) Applicant: Venti Group, LLC, Laguna Hills, CA (US)

(72) Inventor: William Ernest Payne, Dallas, TX (US)

(73) Assignee: VENTI GROUP, LLC, Laguna Hills, CA (US)

( * ) Notice: Subject to any disclaimer, the term of this patent is extended or adjusted under 35 U.S.C. 154(b) by 629 days.

This patent is subject to a terminal disclaimer.

(21) Appl. No.: 14/133,444

(22) Filed: Dec. 18, 2013

(65) Prior Publication Data

US 2014/0236546 A1 Aug. 21, 2014

Related U.S. Application Data

(63) Continuation of application No. 13/887,054, filed on May 3, 2013, now Pat. No. 8,638,270, which is a
(Continued)

(51) Int. Cl.
*H01Q 1/36* (2006.01)
*G06F 17/50* (2006.01)
(Continued)

(52) U.S. Cl.
CPC .......... *G06F 17/5009* (2013.01); *H01Q 1/36* (2013.01); *H01Q 9/28* (2013.01); *H01Q 21/205* (2013.01); *H01Q 21/24* (2013.01); *H01Q 21/26* (2013.01)

(58) Field of Classification Search
CPC .......... H01Q 1/36; H01Q 9/28; H01Q 21/205; H01Q 21/24; H01Q 21/26; G06F 17/50; G06F 17/5009; G06F 17/5045
See application file for complete search history.

(56) References Cited

U.S. PATENT DOCUMENTS

| 2,086,976 A | 7/1937 | Brown |
| 2,245,693 A | 6/1941 | Lindenblad |
| (Continued) | | |

FOREIGN PATENT DOCUMENTS

| EP | 1100148 | 5/2001 |
| GB | 463254 A | 3/1937 |
| (Continued) | | |

OTHER PUBLICATIONS

Freescale Semiconductor, Inc.; Compact Integrated Antennas; Freescale Semiconductor Application Note; Document No. AN2731; Rev. 1.4; Jul. 2006.
(Continued)

*Primary Examiner* — Hoang Nguyen
(74) *Attorney, Agent, or Firm* — Knobbe, Martens, Olson & Bear, LLP

(57) ABSTRACT

An apparatus has an improved antenna pattern for a cross dipole antenna. Such antennas desirably have an omnidirectional antenna pattern. Conventional cross dipole antennas exhibit nulls in their antenna patterns, which can cause antennas to deviate from a standard or specification. Applicant recognized and confirmed that the connection of a coaxial cable to the antenna arms is a cause of the nulls in the antenna pattern, and has devised techniques disclosed herein to compensate or cancel the effects of the connection. In one embodiment, the arms of the cross dipole antenna that are coupled to a center conductor of the coaxial cable remain of conventional length, but the arms of the cross dipole antenna that are coupled to a shield of the coaxial cable are lengthened by a fraction of the radius of the outer diameter of the coaxial cable.

6 Claims, 15 Drawing Sheets

Related U.S. Application Data continuation of application No. 13/617,954, filed on Sep. 14, 2012, now Pat. No. 8,441,406, which is a continuation of application No. 12/841,048, filed on Jul. 21, 2010, now Pat. No. 8,325,101, which is a continuation-in-part of application No. 12/784,992, filed on May 21, 2010, now Pat. No. 8,289,218, which is a continuation-in-part of application No. 12/534,703, filed on Aug. 3, 2009, now Pat. No. 8,427,385.

(51) Int. Cl.

| | | |
|---|---|---|
| *H01Q 9/28* | (2006.01) | |
| *H01Q 21/20* | (2006.01) | |
| *H01Q 21/24* | (2006.01) | |
| *H01Q 21/26* | (2006.01) | |

(56) References Cited

U.S. PATENT DOCUMENTS

| | | |
|---|---|---|
| 2,275,030 A | 3/1942 | Epstein |
| 2,290,800 A | 7/1942 | Brown |
| 2,420,967 A | 5/1947 | Moore |
| 2,432,858 A | 12/1947 | Brown |
| 2,570,579 A | 10/1951 | Masters |
| 2,643,334 A | 6/1953 | Cox |
| 2,847,670 A | 8/1958 | Cox |
| 2,867,804 A | 1/1959 | Gihring |
| 2,976,534 A | 3/1961 | Kampinsky |
| 3,262,121 A | 7/1966 | Holloway |
| 3,413,644 A | 11/1968 | Laus et al. |
| 3,546,705 A | 12/1970 | Lemson |
| 3,725,943 A | 4/1973 | Spanos |
| 3,742,510 A | 6/1973 | Spanos |
| 3,771,162 A | 11/1973 | Dienes |
| 3,789,416 A | 1/1974 | Kuecken et al. |
| 3,805,266 A | 4/1974 | Fletcher et al. |
| 3,896,450 A | 7/1975 | Fitzroy et al. |
| 3,919,710 A | 11/1975 | Fletcher et al. |
| 3,922,683 A | 11/1975 | Kumpebeck |
| 3,932,874 A | 1/1976 | Woodward |
| 4,062,019 A | 12/1977 | Woodward et al. |
| 4,109,254 A | 8/1978 | Woloszezuk |
| 4,180,820 A | 12/1979 | Johns |
| 4,403,222 A | 9/1983 | Bitter, Jr. et al. |
| 4,543,579 A | 9/1985 | Teshirogi |
| 4,633,265 A | 12/1986 | Wheeler |
| 5,293,176 A | 3/1994 | Elliot |
| 5,526,009 A | 6/1996 | Mileski |
| 5,796,372 A | 8/1998 | Elliot |
| 6,028,563 A | 2/2000 | Higgins |
| 6,163,306 A | 12/2000 | Nakamura et al. |
| 6,255,998 B1 | 7/2001 | Podger |
| 6,271,800 B1 | 8/2001 | Nakamura et al. |
| 6,741,220 B2 | 5/2004 | Inoue |
| 7,053,852 B2 | 5/2006 | Timofeev et al. |
| 7,446,727 B2 | 11/2008 | Kai et al. |
| 8,068,066 B2 | 11/2011 | Perkins, III |
| 8,289,218 B2 | 10/2012 | Payne |
| 8,325,101 B2 * | 12/2012 | Payne ............... H01Q 1/36 343/792 |
| 8,427,385 B2 | 4/2013 | Payne |
| 8,441,406 B2 | 5/2013 | Payne |
| 8,638,270 B2 | 1/2014 | Payne |
| 2002/0158808 A1 | 10/2002 | Inoue |
| 2009/0002252 A1 | 1/2009 | Fanton |

FOREIGN PATENT DOCUMENTS

| | | |
|---|---|---|
| JP | 04-291806 | 10/1992 |
| JP | 6177635 A | 6/1994 |
| KR | 10-0733999 | 6/2007 |

OTHER PUBLICATIONS

Hu, et al.; Design of the Cross-Dipole Antenna with Near-Hemispherical Coverage in Finite-Element Phased Array by Using Genetic Algorithms; 2000 IEEE International Conference on Phased Array Systems and Technology, Dana Point, California; pp. 303-306; May 21-25, 2000; Institute of Electrical and Electronics Engineers, New York, USA.

International Searching Authority; Notification of Transmittal of the International Search Report and the Written Opinion of the International Searching Authority, or the Declaration, the International Search Report, and Written Opinion of the International Searching Authority of PCT Application PCT/US2010/043767, filed Jul. 29, 2010; mailed Feb. 23, 2011; Korean Intellectual Property Office, Daejeon, Republic of Korea.

Ronald E. Goans; Basic Antenna Theory; Apr. 8, 2008; Department of Physics and Astronomy, The University of Tennessee, Knoxville, Tennessee 37996, USA.

USPTO; Office Action dated Mar. 19, 2012, from related U.S. Appl. No. 12/534,703, filed Aug. 3, 2009.

Ye, et al.; "The Study on the Low Profile Array with High Gain"; 3rd European Conference on Antennas and Propagation, Berlin, Germany; Mar. 23-27, 2009; pp. 1547-1551; Institute of Electrical and Electronics Engineers, New York, USA.

European Patent Office; Extended European Search Report; Munich; Dec. 18, 2012.

Chinese Patent Office; Office Action dated Nov. 5, 2013, from related Chinese application No. 201080034367.5.

* cited by examiner

Unequal Amplitudes

CROSS-DIPOLE ANTENNA CONFIGURATIONS

CROSS-REFERENCE TO RELATED APPLICATION

This application is a continuation of U.S. application Ser. No. 13/887,054, filed May 3, 2013, which is a continuation of U.S. application Ser. No. 13/617,954, filed Sep. 14, 2012, now U.S. Pat. No. 8,441,406, issued May 14, 2013, which is a continuation of U.S. application Ser. No. 12/841,048, filed Jul. 21, 2010, now U.S. Pat. No. 8,325,101, issued Dec. 4, 2012, which in turn is a continuation-in-part (CIP) application of U.S. application Ser. No. 12/784,992, filed May 21, 2010, now U.S. Pat. No. 8,289,218, issued Oct. 16, 2012, which in turn is a continuation-in-part (CIP) application of U.S. application Ser. No. 12/534,703, filed Aug. 3, 2009, now U.S. Pat. No. 8,427,385, issued Apr. 23, 2013, the disclosures of each of which are hereby incorporated by reference in their entireties herein.

BACKGROUND

Field of the Invention

The invention generally relates to radio frequency antennas, and in particular, to omnidirectional antennas. A better transmission field (antenna pattern) permits lower transmitter power settings to be used, which conserves power.

Description of the Related Art

In certain situations, an antenna with an omnidirectional pattern is desirable. For instance, such a characteristic is typically preferred for an antenna in a transmitter application, such as a wireless access point. In other situations, an omnidirectional pattern may be required by a regulation, such as an FCC regulation. In other situations, antenna having a relatively good axial ratio characteristics for circularly polarized waves is desired.

One example of a conventional omnidirectional antenna is known as a turnstile antenna. Such an antenna is constructed from four quarter wavelength arms, and each arm is energized with 90 degree phase intervals between each arm. 0 and 180 degrees of phase shift are available from the center core (or center conductor) and the shield (or outer conductor), respectively, of a coaxial cable. For 90 and 270 degrees, typically, a quarter wavelength phase shift is implemented with a length of cable a quarter wavelength long. See, for example, U.S. Pat. No. 2,086,976 to Brown. Other phase shifting circuits can also be used. See, for example, U.S. Pat. No. 3,725,943 to Spanos.

Another example of a conventional omnidirectional antenna is known as a cross-dipole antenna. A cross-dipole antenna is driven by a single coaxial cable and is advantageously compact. In addition, one pair of arms (first dipole) is longer than a second pair of arms (second dipole) such that in an ideal case, phase shifts of 45, 135, 225, 315 degrees are established by the arms themselves without a need for an external phase shifter or a second coax. See, for example, U.S. Pat. No. 2,420,967 to Moore; the background discussion (FIG. 7) within U.S. Pat. No. 6,163,306 to Nakamura, et al.; Japanese Patent Application Publication No. H04-291806 by Kazama; and the background discussion (FIG. 10B) within U.S. Pat. No. 6,271,800 to Nakamura, et al.

However, Applicant has observed that conventional omnidirectional antennas, such as conventional cross-dipole antennas, undesirably exhibit null patterns, which can cause an antenna or a system to fail a specification, reduce yield, or otherwise incur costly tuning procedures.

FIG. 1 illustrates an antenna pattern 102 that results when the arms of the cross-dipole antenna are driven by currents of unequal amplitudes. FIG. 2 illustrates an antenna pattern 202 that results when the arms of the cross-dipole antenna are not driven with precise 90 degree phase shifts, that is, are not in quadrature. Each of the patterns illustrated in FIGS. 1 and 2 is easily correctable by one of ordinary skill in the art, as the source of the problem was recognized.

FIG. 3 illustrates a top-view of a prior art cross-dipole antenna. See, for example, U.S. Pat. No. 2,420,967 to Moore. A coaxial structure, such as a coaxial cable feedline, connector, bracket, adapter, frame, or the like, includes a center conductor 302 and an outer shield 304. In a coaxial cable, a dielectric material fills the space between the center conductor 302 and the outer shield 304.

In counterclockwise order from above, the antenna has a first arm 312, a second arm 314, a third arm 316, and a fourth arm 318. A mirror image of the antenna is also applicable. In the conventional cross-dipole antenna, the first arm 312 and the third arm 316 share the same length (as measured from the center of the coaxial structure). The second arm 314 and the fourth arm 318 share the same length.

FIG. 4 illustrates an example of an antenna pattern for a cross-dipole antenna according to the prior art that can be encountered when the diameter of the outer conductor (shield) of a coaxial cable is not negligible with respect to wavelength. The antenna pattern can vary substantially from that of a desired omnidirectional pattern. The pattern 402 illustrated in FIG. 4 is based on a simulation as will be discussed later in connection with FIG. 8. The antenna phasors 404 are not of equal magnitude and are offset from a quadrature orientation (90 degrees). Applicant is not aware of conventional techniques in the art for correcting the asymmetric antenna pattern illustrated in FIG. 4 that is encountered with cross-dipole antennas.

SUMMARY OF THE DISCLOSURE

An apparatus has an improved antenna pattern for a cross dipole antenna. Such antennas desirably have an omnidirectional antenna pattern. Conventional cross dipole antennas exhibit nulls in their antenna patterns, which can cause antennas to deviate from a standard or specification. Applicant recognized and confirmed that the connection of a coaxial cable to the antenna arms is a cause of the nulls in the antenna pattern, and has devised techniques disclosed herein to compensate or cancel the effects of the connection. In one embodiment, the arms of the cross dipole antenna that are coupled to a center conductor of the coaxial cable remain of conventional length, but the arms of the cross dipole antenna that are coupled to a shield of the coaxial cable are lengthened by a fraction of the radius (half the diameter) of the coaxial cable.

One embodiment is an apparatus, wherein the apparatus includes: a cross dipole antenna having a first polarization orientation, the cross dipole antenna comprising: a coaxial structure having a center conductor and an outer shield having an outer diameter with corresponding radius R; a plurality of conductive arms comprising at least a first arm, a second arm, a third arm, and a fourth arm, wherein the plurality lie generally in a plane and are spaced apart from each other by about 90 degrees, such that a proximal end of each of the plurality of arms is arranged near a center point and wherein each of the plurality of arms extends generally outward at a distal end, wherein: the first arm is electrically coupled to the center conductor at a proximal end and has a first predetermined length; the second arm is electrically coupled to the center conductor at a proximal end and has a second predetermined length different from the first predetermined length; the third arm is electrically coupled to the outer shield at a proximal end and has a third predetermined length, wherein the third predetermined length is equal to the sum of the first predetermined length and 0.15 to 1.5 times the radius R, the third arm extending opposite the first arm such that the third arm and the first arm form a first dipole; and the fourth arm is electrically coupled to the outer shield at a proximal end and has a fourth predetermined length, wherein the fourth predetermined length is equal to the sum of the second predetermined length and 0.15 to 1.5 times the radius R, the fourth arm extending opposite the second arm such that the fourth arm and the second arm form a second dipole; and a second antenna having a second polarization orthogonal to the first polarization.

Another embodiment is an apparatus, wherein the apparatus includes: a cross dipole antenna having a first polarization, the cross dipole antenna comprising: a coaxial structure having a center conductor and an outer shield; at least a first arm, a second arm, a third arm, and a fourth arm, wherein the arms lie generally in a plane and are spaced apart from each other by about 90 degrees, wherein a proximal end of each arm is arranged near a center point and wherein each arm extends generally outward at a distal end, wherein: the first arm is electrically coupled to the center conductor at a proximal end; the second arm is electrically coupled to the center conductor at a proximal end; the third arm is electrically coupled to the outer shield at a proximal end, the third arm extending opposite the first arm such that the third arm and the first arm form a first dipole; and the fourth arm is electrically coupled to the outer shield at a proximal end, the fourth arm extending opposite the second arm such that the fourth arm and the second arm form a second dipole; wherein a radius of the outer shield of the coaxial structure is at least one-fiftieth of the shortest of the first arm, the second arm, the third arm, or the fourth arm, and wherein each of the first arm, the second arm, the third arm, and the fourth arm have different predetermined lengths, as measured from a center of the coaxial structure, to compensate for distortion of the antenna pattern induced by the coaxial structure; and a second antenna having a second polarization orthogonal to the first polarization.

Another embodiment is an apparatus, wherein the apparatus includes: a cross dipole antenna having a first polarization, the cross dipole antenna comprising: a coaxial structure having a center conductor and an outer shield, the outer shield having an outer diameter and a corresponding radius R; a first dipole comprising a first pair of arms; and a second dipole comprising a second pair of arms; wherein the arms of at least one pair of the first pair or the second pair have fixed asymmetric lengths such that an arm coupled to the outer shield is longer than an arm coupled to the center conductor, as measured from a center of the coaxial structure, by 0.15 to 1.5 times the radius R; and a second antenna having a second polarization orthogonal to the first polarization.

An apparatus has an improved antenna pattern for a cross dipole antenna. Such antennas desirably have an omnidirectional antenna pattern. Conventional cross dipole antennas exhibit nulls in their antenna patterns, which can cause antennas to deviate from a standard or specification. Applicant recognized and confirmed that the connection of a coaxial cable to the antenna arms is a cause of the nulls in the antenna pattern, and has devised techniques disclosed herein to compensate or cancel the effects of the connection. In one embodiment, the arms of the cross dipole antenna that are coupled to a center conductor of the coaxial cable remain of conventional length, but the arms of the cross dipole antenna that are coupled to a shield of the coaxial cable are lengthened by a fraction of the radius R (half the diameter) of the coaxial cable. In another embodiment, the lengths of all the arms are modified from that of the conventional cross dipole antenna.

Another embodiment is an apparatus, wherein the apparatus includes: a cross dipole antenna having a first polarization and a second polarization, the cross dipole antenna comprising: a coaxial structure having a center conductor and an outer shield; at least a first arm, a second arm, a third arm, and a fourth arm, wherein the arms lie generally in a plane and are spaced apart from each other by about 90 degrees, wherein a proximal end of each arm is arranged near a center point and wherein each arm extends generally outward at a distal end, wherein: the first arm is electrically coupled to the center conductor at a proximal end; the second arm is electrically coupled to the center conductor at a proximal end; the third arm is electrically coupled to the outer shield at a proximal end, the third arm extending opposite the first arm such that the third arm and the first arm form a first dipole; and the fourth arm is electrically coupled to the outer shield at a proximal end, the fourth arm extending opposite the second arm such that the fourth arm and the second arm form a second dipole; wherein a radius of the outer shield of the coaxial structure is at least one-fiftieth of the shortest of the first arm, the second arm, the third arm, or the fourth arm, and wherein each of the first arm, the second arm, the third arm, and the fourth arm have different predetermined lengths, as measured from a center of the coaxial structure, to compensate for distortion of the antenna pattern induced by the coaxial structure; and a second antenna having a third polarization orthogonal to the first polarization and the second polarization of the cross-dipole antenna. In one embodiment, the radius of the outer shield of the coaxial structure is at least one-fiftieth (1/50) of the shortest of the arms of the cross dipole antenna.

Another embodiment is an apparatus, wherein the apparatus includes: a cross dipole antenna having a first polarization and a second polarization, the cross dipole antenna comprising: a coaxial structure having a center conductor and an outer shield, the outer shield having an outer diameter and a corresponding radius R; a first dipole comprising a first pair of arms; and a second dipole comprising a second pair of arms; wherein the arms of at least one pair of the first pair or the second pair have fixed asymmetric lengths such that at least one arm that is coupled to the outer shield is longer than an arm coupled to the center conductor, as measured from a center of the coaxial structure, by 0.15 to 1.5 times the radius R; and a second antenna having a third polarization orthogonal to the first polarization and the second polarization.

In addition, antenna miniaturization techniques can also be employed.

BRIEF DESCRIPTION OF THE DRAWINGS

These drawings (not to scale) and the associated description herein are provided to illustrate specific embodiments of the invention and are not intended to be limiting.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art.

Figure 5:
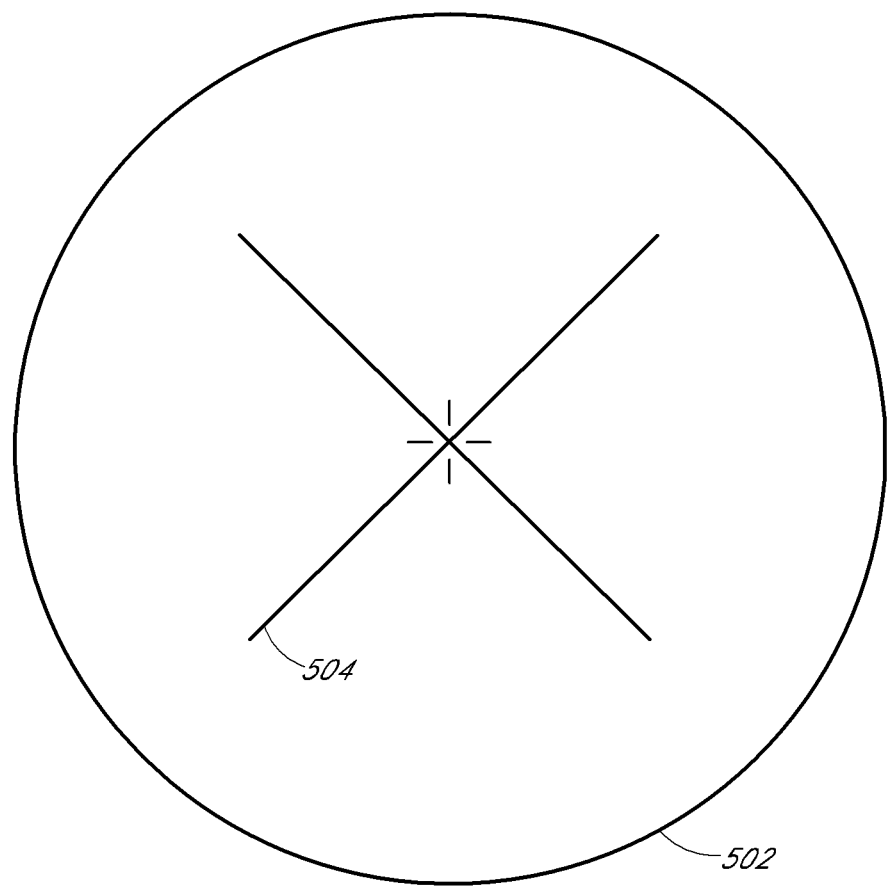
FIG. 5 illustrates an ideal antenna pattern that can be approached by an embodiment of the invention.

FIG. 5 illustrates an ideal antenna pattern 502 that can be approached for an embodiment of the invention. Simulations and laboratory results have indicated that the antenna pattern can be made omnidirectional to within 1 dB even at tens of gigahertz with symmetric antenna phasors 504 in quadrature. In certain applications, the Federal Communications Commission (FCC) or another regulatory body, sets forth antenna requirements. Examples of other regulatory bodies or quasi regulatory bodies include the International Convention for the Safety of Life at Sea (SOLAS), which sets requirements for Search and Rescue Transponders (SARTs); the International Maritime Organization (IMO), which recommends SART performance standards in Resolution A.802 (19); and the International Telecommunications Union (ITU), which establishes technical characteristics to achieve IMO recommended performance and compliance with SOLAS and publishes Recommendation ITU-R M.628-4, which includes antenna characteristics. Regulatory bodies such as the FCC typically incorporate these standards by reference. In one example, ITU-R M.628.4 requires omnidirectional on the horizon+/−2 dB, with polarization also horizontal. The polarization of a linearly polarized antenna can vary depending upon its orientation when used. For example, a cell phone can be oriented in a variety of positions, such as resting flat on a table, or carried vertically when next to a user's ear. Thus, various linearly polarized antennas can generate vertically polarized waves, horizontally polarized waves, or both vertically and horizontally polarized waves depending on its orientation. In addition, depending on a user's perspective to a cross-dipole antenna or a turnstile antenna, the polarization can vary. When a cross-dipole antenna is mounted horizontally such that the arms of the antenna are horizontal, the polarization of the waves radiated by the antenna near the horizon is horizontal and the antenna is approximately omnidirectional. Disclosed techniques improve the omnidirectionality of the cross-dipole antenna when mounted horizontally. Such horizontal mounting is useful in, for example, wireless access point applications. With respect to zenith or nadir orientation, the cross-dipole antenna exhibits a circular polarization with either right-hand or left-hand polarization depending on the phasing of the arms. In one embodiment, such as in a SOLAS application in which radiation with respect to zenith or nadir is not needed and the cross-dipole antenna has a horizontal orientation, the arms of the cross-dipole antenna can optionally be sandwiched between reflectors to redirect energy from the zenith or nadir direction to the horizontal direction. However, the improvement in phasing among the arms also improves the axial ratio characteristics of circularly polarized waves. The axial ratio is the ratio of the magnitudes of the major and minor axis defined by the electric field vector. In one embodiment, with the improved phasing among the arms, the axial ratio of the circularly polarized waves can approach 1.

Applicant theorized and confirmed with both simulations and in tests that at relatively high frequencies, the connection of the antenna to the coaxial cable distorts the antenna pattern. In the distant past, such distortions were relatively small because radio frequencies were relatively low and had correspondingly long wavelengths. However, many modern devices use relatively high frequencies. For example, under the wireless local area network standards of IEEE 802.11, applicable frequencies are in the 2.4, 3.6, and 5 gigahertz (GHz) range. In another example, the broadband wireless access standards of IEEE 802.16 use frequency bands from 10 to 66 GHz, from 2 to 11 GHz and so on. At relatively high frequencies, the wavelengths can be relatively short. For example, a signal with a frequency of 10 GHz has a wavelength of only about 3 centimeters. The shield diameter of a coaxial cable can vary widely depending on the cable, but commonly runs in the range of a few to several millimeters.

Applicant recognized that while design tools predicted an omnidirectional antenna pattern for a cross dipole antenna, in practice, an antenna pattern would exhibit unacceptable nulls. These nulls can undesirably cause "dead spots" in coverage. Applicant recognized that there were additional phase shifts due to the coaxial cable diameter, which while negligible at relatively low frequencies and relatively long wavelengths, are not negligible at high frequencies. In one embodiment, when the radius (half the diameter) of the outer shield of the coaxial cable is at least 2-3 percent of the intended wavelength for the antenna, then the disclosed techniques should be used. A resulting antenna has a more omnidirectional antenna pattern with better coverage.

Figure 6:
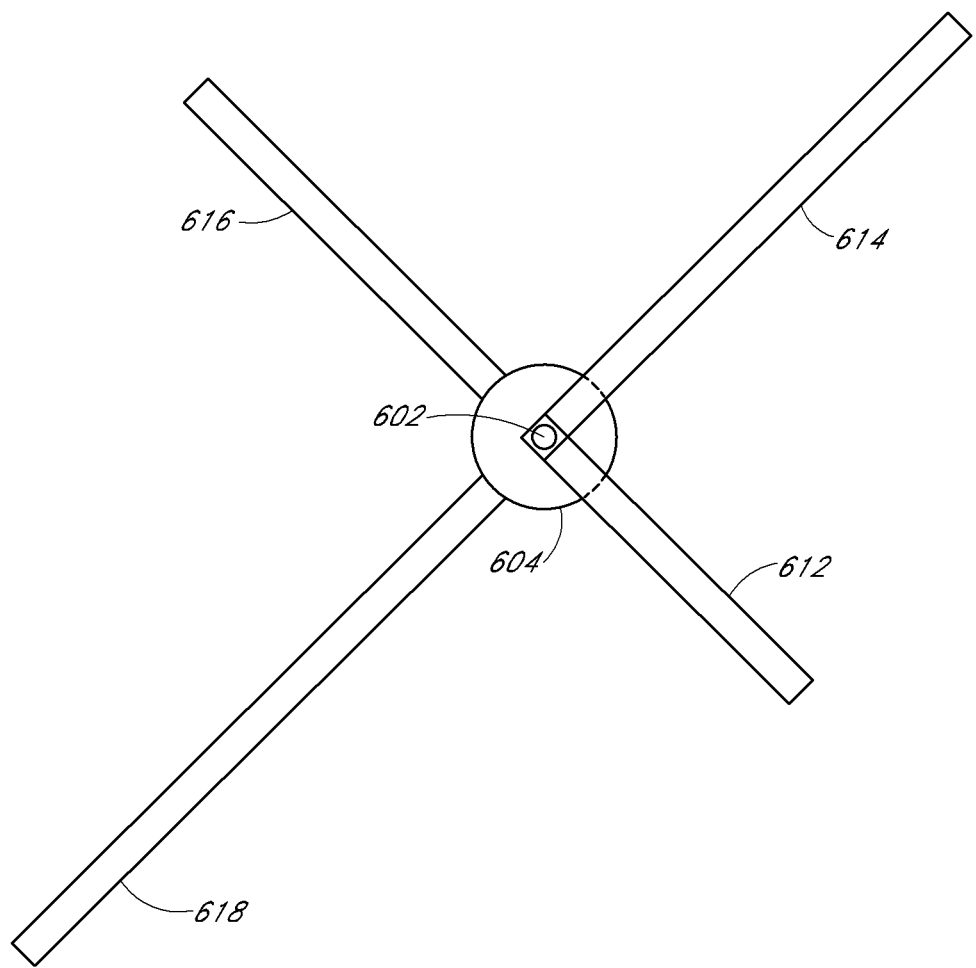
FIG. 6 illustrates a top-view of a cross-dipole antenna according to an embodiment of the invention.

FIG. 6 illustrates a top-view of a cross dipole antenna according to an embodiment of the invention. The drawing is not to scale. Differences in arm length have been exaggerated to make the improvements easier to see. A coaxial structure is also shown. The coaxial structure can correspond to, for example, a coaxial cable, a connector for a coaxial cable, an adaptor, or part of the frame of the antenna itself. In FIG. 6, only conductive portions of the cross dipole antenna are shown. While only a single cross dipole antenna is shown, embodiments of the invention are applicable to arrays of cross dipole antennas, such as in a bayed array. In addition, while illustrated in connection with relatively thin, elongated arms, the arms of the antenna can have varying shapes.

The coaxial structure includes a center conductor 602 and an outer shield 604. In a coaxial cable, a dielectric material fills the space between the center conductor 602 and the outer shield 604.

In counterclockwise order from above, the antenna has a first arm 612, a second arm 614, a third arm 616, and a fourth arm 618. A mirror image of the antenna is also applicable. In one embodiment, the arms 612, 614, 616, 618 are "fan" shaped and fabricated on a printed circuit. None of the arms 612, 614, 616, 618 of the illustrated have the same length, as the optimization technique is applied to each dipole. However, as will be discussed later, in a suboptimal solution, the optimization technique is applied to only one dipole of the pair of dipoles. One of ordinary skill in the art will appreciate that the precise dimensions of the cross dipole antenna will vary depending on the coaxial feedline diameter and the intended frequency band for the antenna.

The first arm 612 and the third arm 616 form a first dipole. The second arm 614 and the fourth arm 618 form a second dipole. In a conventional cross dipole antenna, the first arm 612 and the third arm 616 each have the same length, and each is shorter than half a wavelength for the intended frequency band. Also, in a conventional cross dipole antenna, the second arm 614 and the fourth arm 618 have the same length, and each is longer than half a wavelength for the intended frequency band.

In the illustrated embodiment, the first arm 612 and the second arm 614, both of which are electrically coupled to the center conductor 602 of the coaxial structure, are of conventional length. The third arm 616 and the fourth arm 618 are electrically coupled to the outer shield 604 of the coaxial structure, and are longer than conventional length, preferably by about 0.6 times the radius R of the outer shield 604.

TABLE I

| arm | connection | relative angle | arm length |
|---|---|---|---|
| first arm 612 | center | 0° | aλ |
| second arm 614 | center | 90° | bλ |
| third arm 616 | shield | 180° | aλ + xR |
| fourth arm 618 | shield | 270° | bλ + xR |

Figure 1:
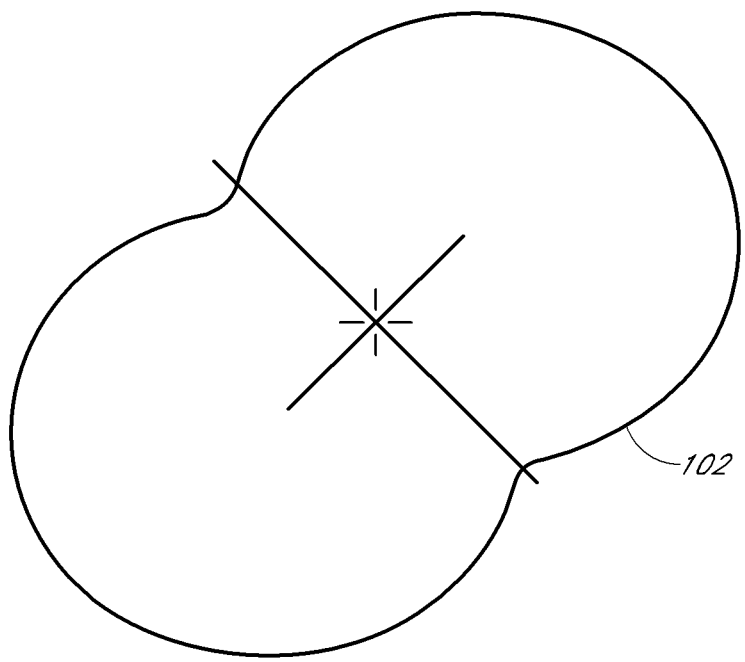
FIG. 1 illustrates an example of an antenna pattern for a conventional crossed-dipole antenna with uneven current distribution.
Figure 2:
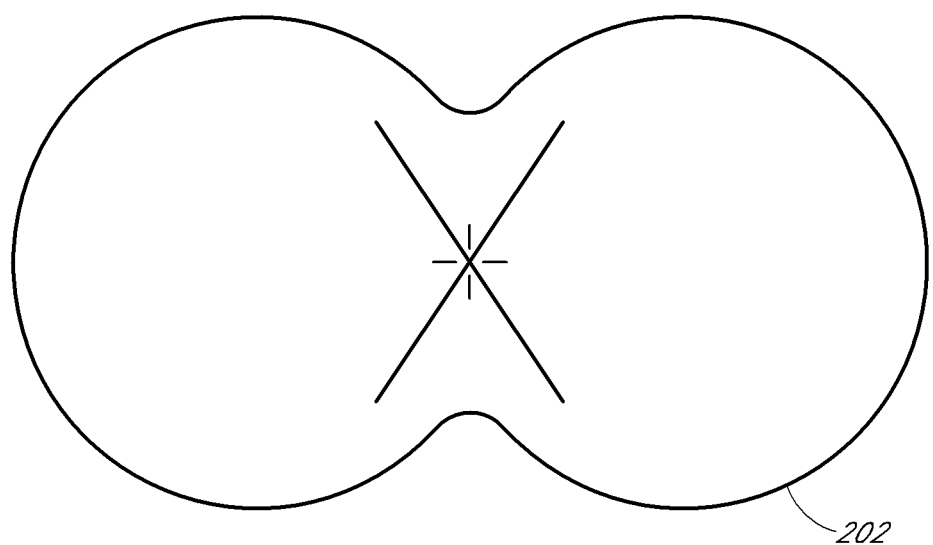
FIG. 2 illustrates an example of an antenna pattern for a conventional crossed-dipole with non-uniform phase separation.
Figure 3:
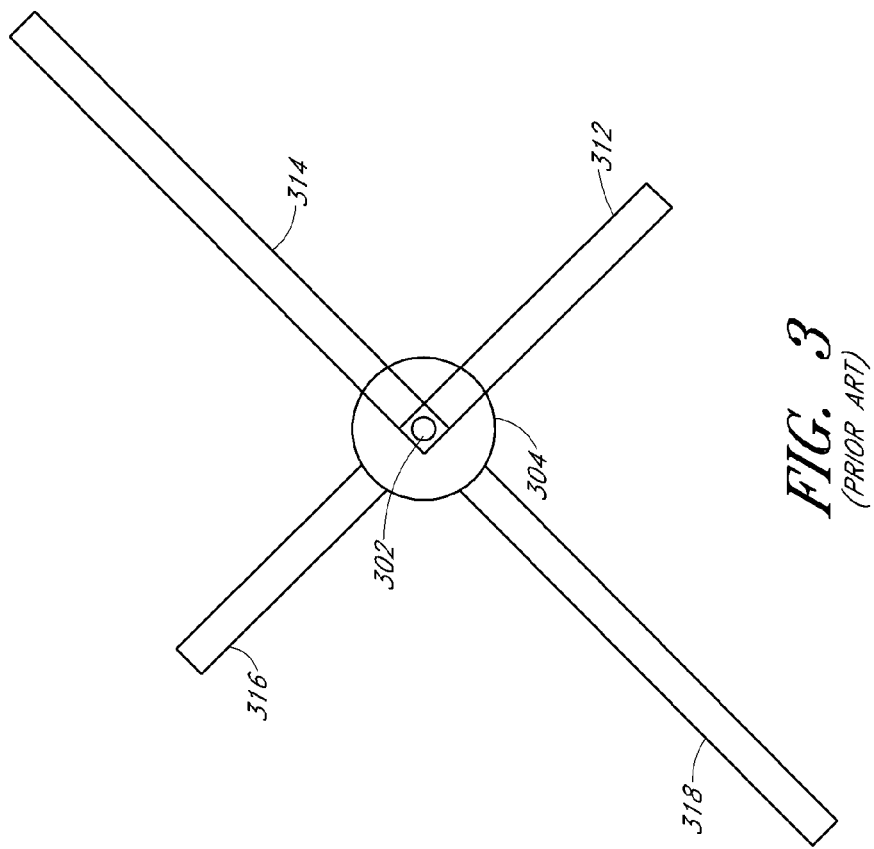
FIG. 3 illustrates a top-view of a prior art cross-dipole antenna.
Figure 4:
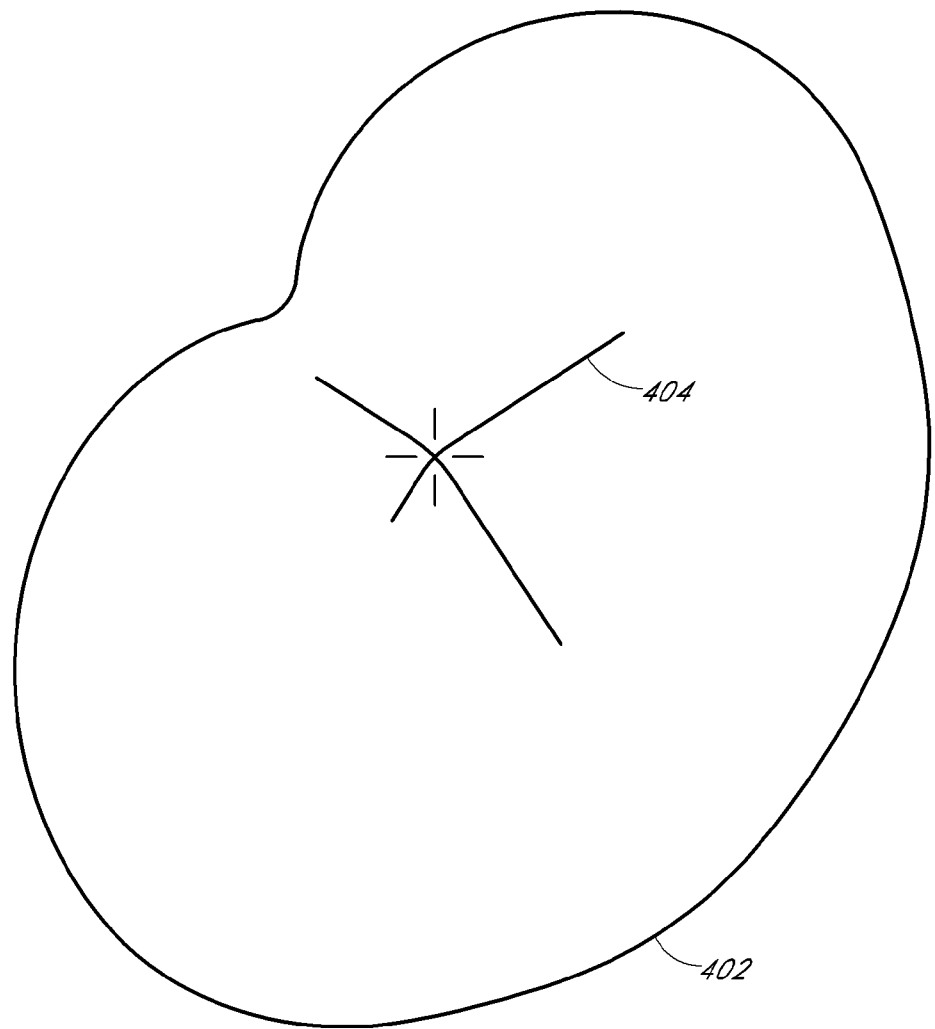
FIG. 4 illustrates an example of an asymmetric antenna pattern for a conventional crossed-dipole antenna.

Table I summarizes the connections, the relative angles, and the arm lengths for the antenna. The lengths of each arm are described from the center of the coaxial feedline to a distal end, wherein a proximal end of each arm is connected to either the center conductor or to the outer shield, as appropriate. In contrast to the conventional art, the arm lengths of each dipole are not the same. In the illustrated embodiment, the first arm 612 and the second arm 614 are shorter than the corresponding arms 312, 314 (FIG. 3) of the conventional art, and the third arm 616 and the fourth arm 618 are longer than the corresponding arms 316, 318 (FIG. 3) of the conventional art. In Table 1, the factor a corresponds to the fraction used for the shorter arms of the conventional cross dipole antenna. The factor b corresponds to the fraction used for the longer arms of the conventional cross dipole antenna. Typically, a skilled practitioner uses 0.5 as a starting point for factor a and for factor b, and reduces a to make the corresponding arms more capacitive and lengthens b to make the corresponding arms more inductive. This advances and retards the phase by 45 degrees, which in turn generate the quadrature phase relationships among the arms. Vector voltmeters, network analyzers, and simulation models are typically employed to generate the desired lengths corresponding to factor a and factor b. Applicant has recognized that the radius R (half the diameter) of the outer conductor of the corresponding coaxial structure, such as coaxial cable, impacts the arm length for those arms connected to the outer conductor. The distorting effect on the antenna pattern caused by the outer conductor becomes more acute as the coaxial structure outer diameter becomes larger relative to the length of the arms. As frequencies go up, the arm lengths decrease. In addition, since larger diameter coaxial structures have less loss at high frequencies, it is desirable to use larger diameter coaxial structures as frequency goes up. In one embodiment, disclosed techniques provide a noticeable benefit to antenna pattern above 1 GHz. In one embodiment, the illustrated techniques are applicable when the radius of the outer shield of the coaxial structure is at least one-fiftieth (1/50) of the shortest of the arms 612, 614, 616, 618 or at least one-thirtieth (1/30) of the shortest of the arms 612, 614, 616, 618.

The constant R represents the radius of the outer shield 604 of the coaxial structure. The factor x corresponds to the fraction, preferably about 0.6, which is multiplied by the radius R and added to the lengths of the third arm 616 and the fourth arm 618. The additional length from factor x does not have to be the same for the third arm 616 and the fourth arm 618. However, the factor x can vary in a relatively broad range. For example, x can vary between about 0.54 to about 0.66. In another example, x can vary between about 0.48 to about 0.72. In another example, x can vary between about 0.42 to about 0.78. In another example, x can vary between about 0.3 to about 1.2. In another example, x can vary between about 0.15 to about 1.15. Other applicable values for x will be readily determined by one of ordinary skill in the art.

The modified arm lengths are of critical nature for the antenna pattern for operation at high frequencies. In one embodiment, the arm lengths are of predetermined length or fixed length and are not adjustable by an end user. For example, each arm can be formed from conductive traces on a circuit board. In alternative embodiments, the arms can be constructed from rods, tubes, wire frames, plates, and the like.

Figure 7:
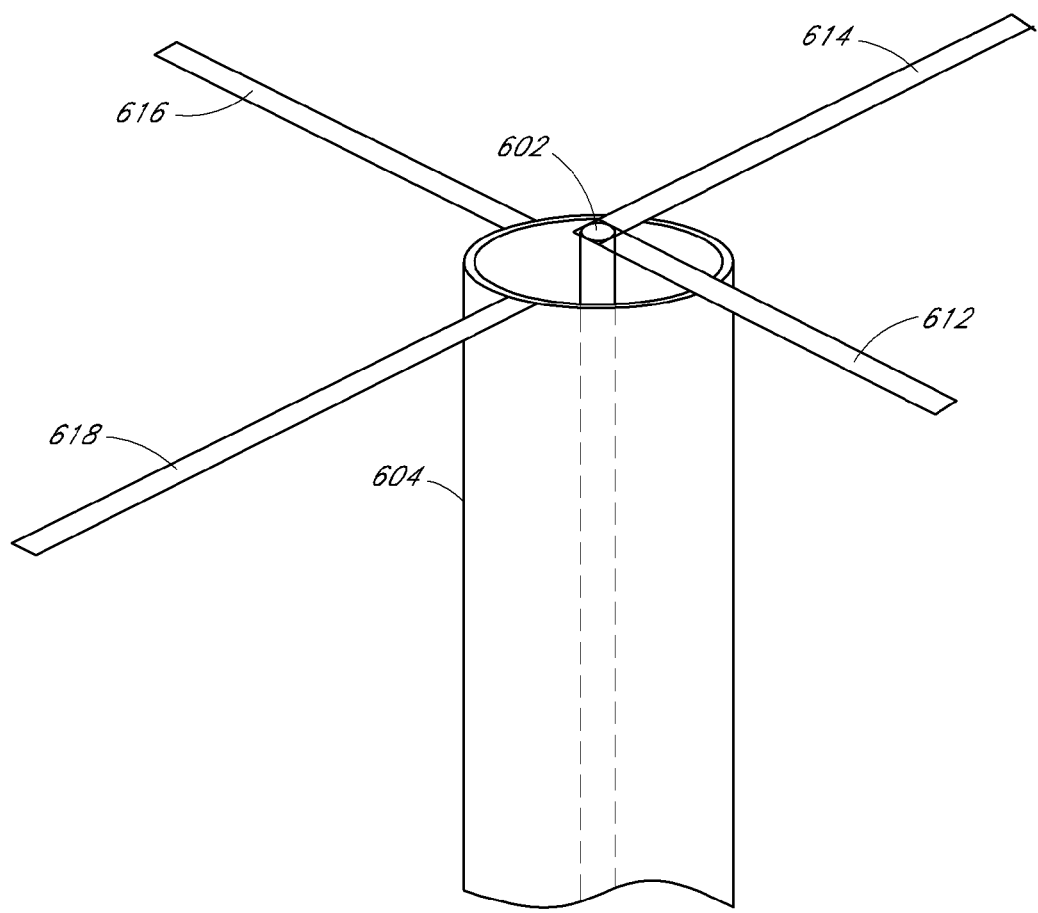
FIG. 7 illustrates a perspective view of an embodiment of the cross dipole antenna.

FIG. 7 illustrates a perspective view of the embodiment of the cross dipole antenna described earlier in connection with FIG. 6. Again, only conductive portions of the antenna are illustrated. The same parts appearing in FIGS. 6 and 7 are designated by the same reference number. As discussed earlier in connection with FIG. 6, the mirror image of the illustrated embodiment is also applicable.

As no tuning is required, the arms 612, 614, 616, 618 of the antenna can be implemented with conductive traces (typically copper) on a printed circuit board. For example, the first arm 612 and the second arm 614 can be formed on a first side (for example, upper) of the circuit board, and the third arm 616 and the fourth arm 618 can be formed on a second side (for example, lower) of the circuit board. For example, the center conductor 602 can be soldered to electrically connect to the traces for the first arm 612 and the second arm 614, and the outer shield 604 can be soldered to connect to the traces for the third arm 616 and the fourth arm 618. In an alternative embodiment, the traces are formed on different layers of a circuit board, which are not necessarily on opposite sides of the circuit board. Of course, adapters and/or connectors can also be disposed between the coaxial structure and the arms 612, 614, 616, 618 of the antenna.

Preferably, the length of one arm from each dipole of an antenna is lengthened from that of the standard cross-dipole dimension to compensate for the affects of the coaxial structure. However, in an alternative embodiment, less than each dipole has an arm with a modified length as taught herein.

A variety of software programs can be used to model an antenna. For example, EZNEC, which is software tool available from the following URL: <http://www.eznec.com/> can be used. Applicant scaled size and wavelength by a factor of 1000 (scaling frequency by a factor of 1/1000) to run the simulations illustrated in FIGS. 8 and 9. All dimensions of thousandths of inches were scaled to inches, and frequencies of gigahertz (GHz) were scaled to megahertz (MHz).

Tables II and III illustrate examples of dimensions for antennas suitable for operation at about 9.4 GHz. Table II corresponds to prior art FIG. 3, and Table III corresponds to the embodiment illustrated in FIGS. 6 and 7. These lengths are as measured from the center of the coaxial structure. In addition, the simulation models included a 0.1 inch diameter coaxial cable feedline.

TABLE II

| arm | connection | arm length |
|---|---|---|
| first arm 312 | center | 0.225 inches |
| second arm 314 | center | 0.265 inches |
| third arm 316 | shield | 0.225 inches |
| fourth arm 318 | shield | 0.265 inches |

TABLE III

| arm | connection | arm length |
|---|---|---|
| first arm 612 | center | 0.215 inches |
| second arm 614 | center | 0.250 inches |
| third arm 616 | shield | 0.235 inches |
| fourth arm 618 | shield | 0.280 inches |

The simulations assumed lossless wires and were modeled in free space (no ground). To model the effects of the open end of the shield of the feedline, wires in an octagon pattern were included in the model. In addition, wires in a spoke pattern carried currents to the wires in the octagon pattern for modeling of the open end of the shield.

Figure 8:
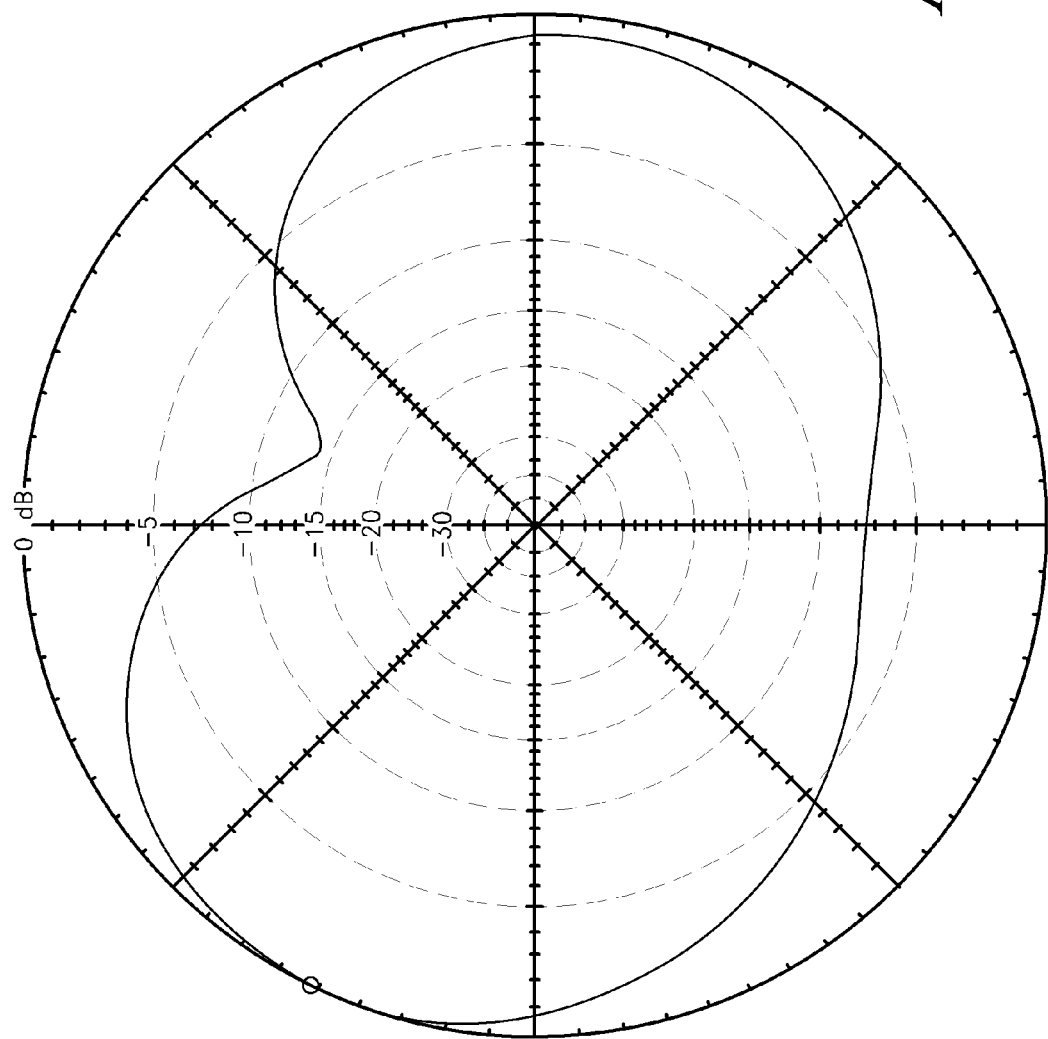
FIG. 8 illustrates simulation results of a prior art antenna.

FIG. 8 illustrates simulation results of a prior art antenna at 9.4 GHz, having the dimensions illustrated in Table II. With the feedline included in the simulation model, the simulation exhibits the "kidney bean" shaped pattern that is undesirable.

Figure 9:
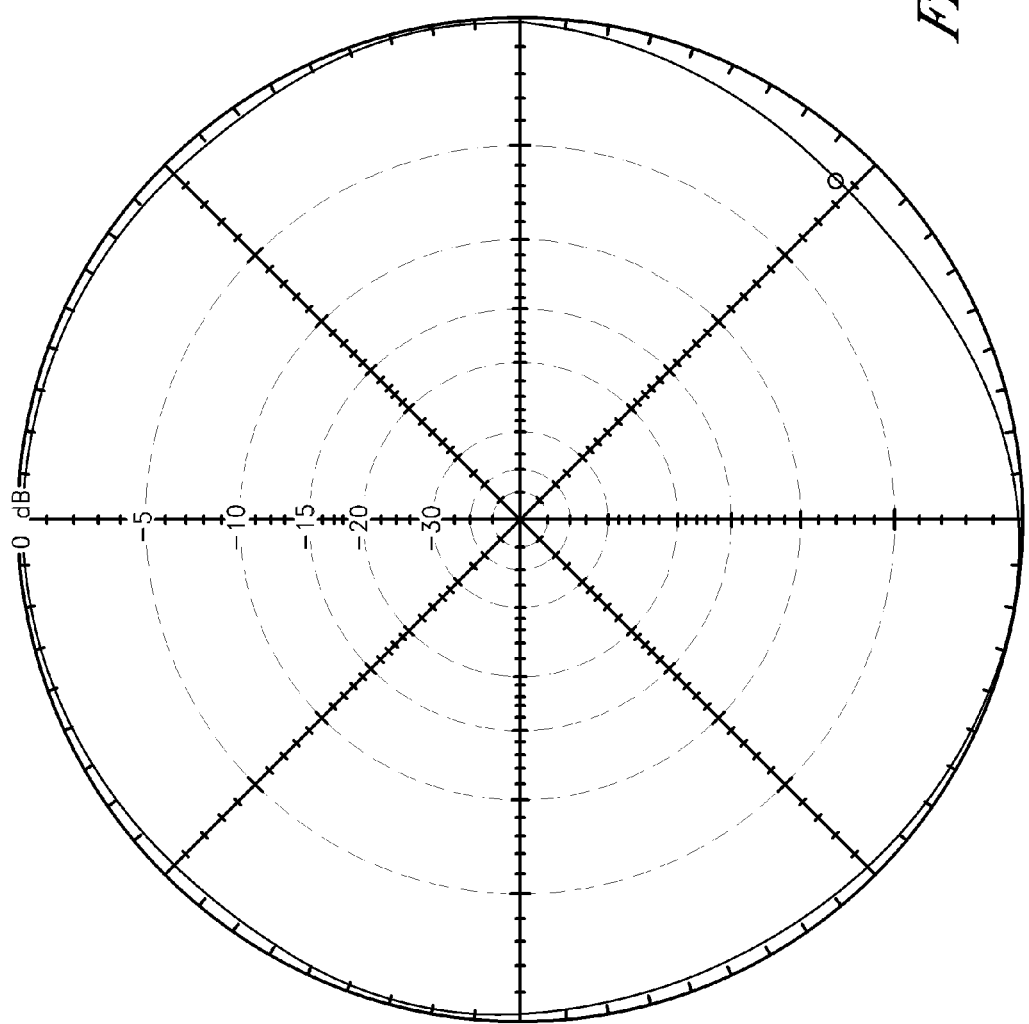
FIG. 9 illustrates simulation results of an embodiment of the cross-dipole antenna.

FIG. 9 illustrates simulation results of an embodiment of the cross-dipole antenna at 9.4 GHz, having the dimensions illustrated in Table III. The feedline is also modeled in FIG. 9. As illustrated by the simulation results, the antenna pattern is nearly omnidirectional. The simulated model corresponds to a flat antenna having "fan" shaped arms that can be readily fabricated on a printed circuit board. Each of the fan-shaped arms is modeled by 3 wires in the simulation.

While illustrated in the context of a single cross dipole, the principles and advantages of the cross dipole antenna described herein are also applicable to antenna arrays, or to combinations with reflectors, such as when the cross-dipole antenna is sandwiched between two disks. Such a configuration is useful in Search and Rescue Transponders (SARTs). In one embodiment, a plurality of cross-dipole antennas can be arranged in an array with a vertical coaxial feedline with sets of arms arranged at spacings along the array's height. In another example with a reflector, the nadir or zenith orientation is desired, and the cross-dipole antenna emanates circularly polarized waves as a feed for the reflector, which can be, for example, a parabolic reflector or "dish," or any other reflector used to create a cavity-backed circularly-polarized antenna. For example, a cross-dipole antenna according to an embodiment of the invention can be combined with a plate on one side of the cross-dipole antenna to feed a dish on the other side of the cross-dipole antenna.

Cross-dipole antenna embodiments of the invention of a particular polarization can advantageously be combined with one or more other antennas having a polarization orthogonal to the polarization of the cross-dipole antenna to form an antenna system featuring orthogonal polarizations, which can be exploited for polarization diversity and/or spatial multiplexing. For example, a cross-dipole antenna having horizontal polarization can be combined with a dipole antenna or a monopole antenna having a vertical polarization. In the case of spatial multiplexing, electromagnetic waves with orthogonal polarizations can carry independent information, which can permit an increase of the data rate as compared to a single-polarized systems. See, for example M. Shafi, M. Zhang, A. L. Moustakas, P. J. Smith, A. F. Molisch, F. Tufvesson, and S. H. Simon, *Polarized MIMO Channels in 3D: Models, Measurements and Mutual Information*, IEEE J. Selected Areas Comm., 24, 514-527 (2006). Thus, the data rate can be approximately doubled compared to a system that cannot transmit/receive orthogonal polarizations. For the case of polarization diversity, the same information can be transmitted on two orthogonal polarizations, and since fading on the two polarizations is independent, polarization diversity provides greater signal robustness. With polarization diversity, the waves having polarizations that are orthogonal to each other interfere with each other much less than waves that do not have orthogonal polarizations. Accordingly, the throughput or data rate that can be carried via a system utilizing horizontal polarization can be nearly double that of a system without polarization diversity. Many configurations combining the cross-dipole antenna with another antenna for polarization diversity are possible, and the following configurations are illustrative and not limiting.

Figure 10:
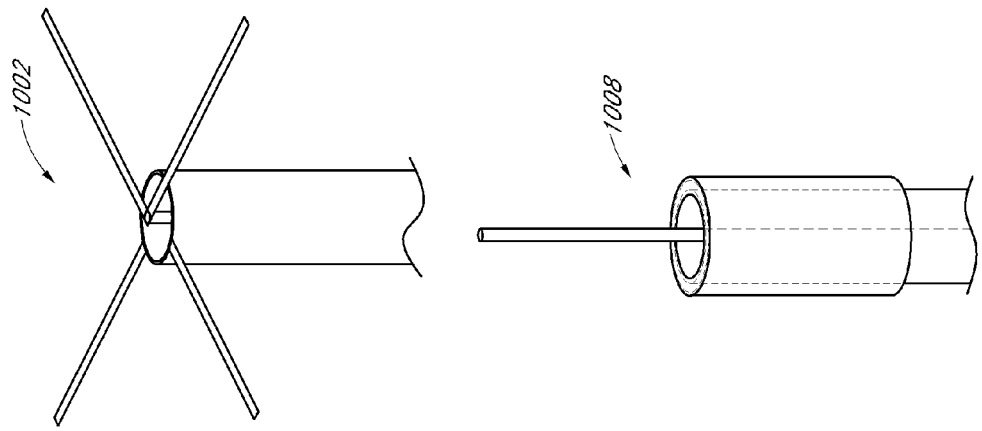
FIG. 10 illustrates an example of a 2×2 array of antennas utilizing polarization diversity.
Figure 10:
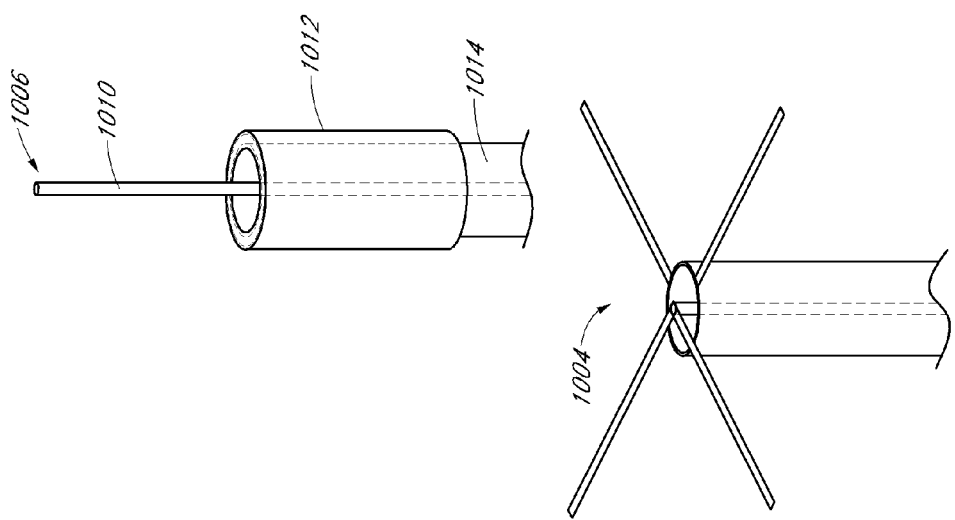

FIG. 10 illustrates an example of a 2×2 array of antennas utilizing polarization diversity. The array can be used as a component of a multiple-input and multiple-output (MIMO) system. Each antenna of the 2×2 array is coupled to its own coaxial structure, which can be a coaxial cable (rigid or flexible). The other end of the coaxial structure can then be coupled to a transmitter, receiver, transmitter/receiver, transceiver, or the like (not shown).

In the illustrated example of FIG. 10, a first cross-dipole antenna 1002 and a second cross-dipole antenna 1004 provide polarization in a first orientation. The first cross-dipole antenna 1002 and the second cross-dipole antenna 1004 can correspond to the cross-dipole antenna described earlier in connection with FIGS. 6 and 7. A first monopole antenna 1006 and a second monopole antenna 1008 provide polarization in a second orientation that is orthogonal to the first orientation. For example, the first polarization can be horizontal, and the second polarization can be vertical.

In one example, the first monopole antenna 1006 is formed by a center conductor portion 1010 and a folded back portion 1012 of the coaxial structure 1014. Each of the center conductor portion 1010 and the folded back portion 1012 is approximately a quarter wavelength for the frequency of interest. The folded back portion 1012 is coupled to the shield of the coaxial structure 1014. Of course, the antennas can be encapsulated in plastic or the like so that the underlying structures may not be visible to the naked eye.

The antennas 1002, 1004, 1006, 1008 can have the same or can have different frequency ranges. In an alternative embodiment, a dipole antenna can be used in place of one or more of the first monopole antenna 1006 and the second monopole antenna 1008.

The array can have dimensions other than 2×2. For example, a smaller array of two antennas, such as the first cross-dipole antenna 1002 and first monopole antenna 1006 with polarization orthogonal to each other can be used.

Another variation corresponds to increasing the size of the array, such as arranging the antenna in a 3×3 array, a 4×4 array, or even larger. Of course, many variations are possible. For example, non-rectangular arrays, such as triangular arrays, circular arrays, and the like are applicable.

Figure 11:
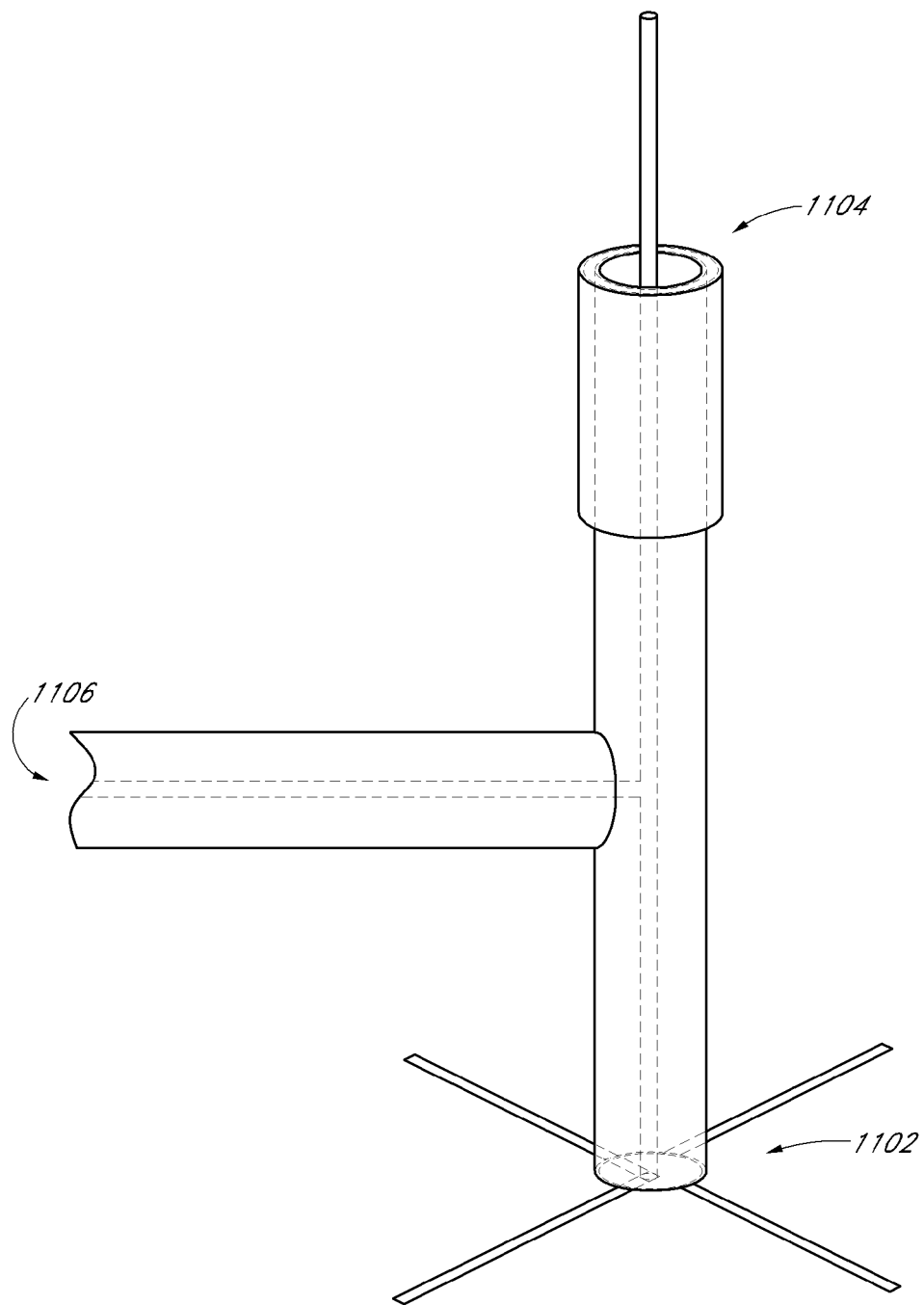
FIG. 11 illustrates another example of polarization diversity using a cross-dipole antenna combined with a monopole antenna in a "tee."

FIG. 11 illustrates another example of antennas with orthogonal polarization using a cross-dipole antenna 1102 combined with a monopole antenna 1104 using a "tee." The illustrated embodiment is an example of an "all-in-one" design. Other "all-in-one" configurations will be readily determined by one of ordinary skill in the art. The cross-dipole antenna 1102 can correspond to the cross-dipole antenna described earlier in connection with FIGS. 6 and 7. An end 1106 of a coaxial structure is coupled to a transmitter, receiver, transmitter/receiver, transceiver or the like. The lengths of sections of the "tee" can be adjusted to correct for impedance mismatches. Techniques such as the Smith Chart can be used to aid the designer.

In the illustrated example, the same feedline feeds both the cross-dipole antenna 1102 and the monopole antenna 1104 to provide two orthogonal polarizations for the same signal(s). When the same feedline feeds both the cross-dipole antenna 1102 and the monopole antenna 1104, a variable phase shifter (not shown) should be inserted between the tee and at least one of the cross-dipole antenna 1102 and the monopole antenna 1104 to generate a relative phase difference between the cross-dipole antenna 1102 and the monopole antenna 1104, said phase shift being chosen such that it leads to an improvement in the signal-to-noise-and-interference ratio of the overall detected signal. In one embodiment, the variable phase shifter corresponds to a device having multiple selectable path lengths which are selected and deselected to change a path length, and thus a phase, of the signal passing through the phase shifter. PIN diodes can be used to activate a particular path. These PIN diodes can be selectively activated in response to a control signal from a control circuit, such as a microprocessor. Off-the-shelf phase shifters can alternatively be used. For example, suitable phase shifters are available from Narda Microwave, Microtek Inc., and the like.

With respect to phase shifting frequency, the frequency for phase shifting a full cycle of phase (360 degrees) can be varied in a very broad range but should be at least as high as the maximum anticipated Doppler shift frequency between a receiver and a transmitter of the system. Of course, the Doppler shift frequency varies with the RF frequency being transmitted. For example, in an example of a WiFi wireless access point, a controller or microprocessor of the wireless access point can control the phase shifting of the variable phase shifter. The phase shifting frequency can be predetermined to a particular frequency, such as, but not limited to, several thousand Hertz, or can be adaptively adjusted in response to varying Doppler frequencies encountered.

In an alternative embodiment, the cross-dipole antenna 1102 and the monopole antenna 1104 can maintain their relative orientations, but instead can be coupled to separate feedlines. The signals to/from the separate feedlines can be up (down) frequency shifted from/to baseband, so that separate processing of the signals in baseband is possible. This approach can be used for both diversity and spatial multiplexing.

While described earlier in the context of a full-size cross-dipole antenna, the principles and advantages of the cross-dipole antenna are also applicable to miniaturized versions of the cross-dipole antenna. Miniaturization in the context of antenna art is not mere scaling. With a full-size cross-dipole antenna, the physical length of an arm of the antenna is the same as the electrical length. Thus, the lengths for the arms described earlier in connection with Tables I, II, and III apply to both the physical length and to the electrical length of the arms.

With antenna miniaturization, the physical length of an arm of a dipole can be shorter than the effective electrical length or virtual length of the arm. The effective electrical length of a miniaturized arm is the corresponding length that the arm would have for electrical performance if it were to be made with a straight, very thin conductor (to avoid capacitive loading) and in free space. Antenna miniaturization techniques are well known in the art and include loading techniques, as well as techniques that encase the antenna in a material with a high relative permittivity and/or a high relative permeability. For an example of loading techniques, the reader is directed to Application Note AN2731 from Freescale Semiconductor, titled *Compact Integrated Antennas*, dated July 2006, revision 1.4, which is available at the following URL: <http://www.freescale.com/files/rf if/doc/app note/AN2731.pdf>.

A very wide range of loading techniques can be used to physically shorten one or more arms of the cross-dipole antenna while maintaining the effective electrical length relationships. With antenna miniaturization, the lengths for the arms described earlier in connection with Tables I, II, and III apply to the effective electrical length of the arms and can vary from the physical lengths for arms that are miniaturized.

Figure 12A:
FIG. 12A illustrates an example of a conventional dipole.

For comparison purposes, FIG. 12A illustrates an example of a conventional dipole. FIGS. 12B-12G illustrate non-exhaustive examples of conventional loading techniques for a dipole that can be applied to one or more arms of a cross-dipole antenna according to an embodiment of the invention. Other loading techniques, including loading techniques yet to be discovered, can also be applicable. In FIGS. 12B-12G, the loading techniques are applied to each arm of a dipole. However, these loading techniques can be applied to one or both arms of a dipole (for example, one unloaded arm and one loaded arm), to one or both dipoles of the cross-dipole antenna, can be combined such that more than one type of loading technique can be applied to a dipole of or to both dipoles of the cross-dipole antenna, and can even be combined such that more than one loading technique can apply to a particular arm of the cross-dipole antenna.

Figure 12B:
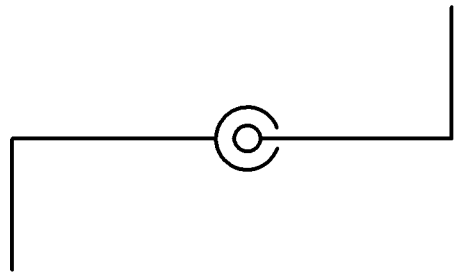
FIGS. 12B-12G illustrate examples of conventional loading techniques for a dipole.
Figure 12C:
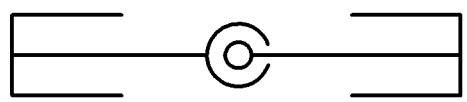
Figure 12D:
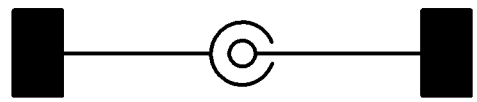

FIG. 12B illustrates an example of a bent dipole. FIG. 12C illustrates an example of a folded, in the illustrated case, double folded, dipole. FIG. 12D illustrates an example of capacitive end loading, which is also known as a "top hat."

Figure 12E:
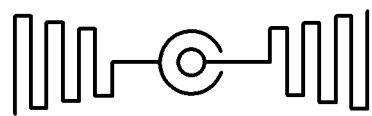
Figure 12F:
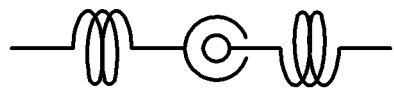
Figure 12G:
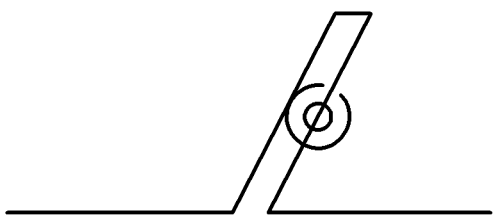

The capacitive end loading can be implemented by using a capacitive plate at the distal end of the arm. FIG. 12E illustrates an example of meander pattern loading. The loading techniques illustrated in FIGS. 12B-12E can be implemented flat in 2-dimensions as shown. This can be advantageous when the antenna is part of an integrated circuit or for other packaging reasons. However, the loading techniques can also be bent, folded, end loaded, or meandered in 3-dimensions. FIG. 12F illustrates an example of inductive loading, which can be typically implemented using coils. FIG. 12G illustrates an example of stub loading in a hairpin configuration. In another example, the arms can have "fan" shapes. With a fan-shaped arm, a portion of the arm at a distal end is wider than a portion of the arm nearer the coaxial structure.

Figure 13A:
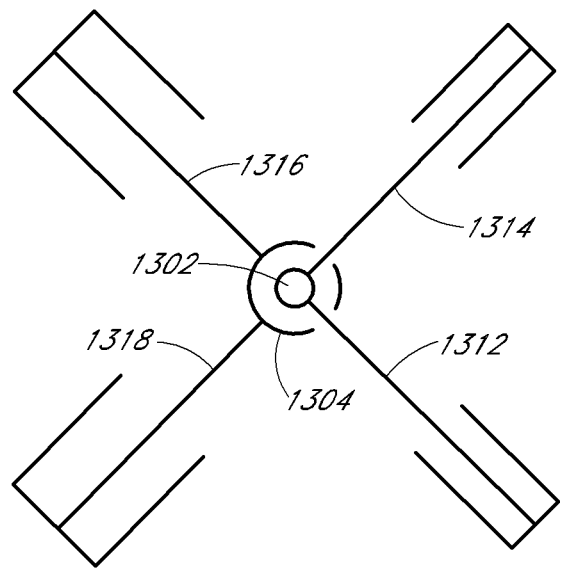
FIG. 13A illustrates a top-view of a cross-dipole antenna according to an embodiment of the invention in which each of the arms is compacted by end folding.

FIG. 13A illustrates a top-view of a cross-dipole antenna according to an embodiment of the invention in which each of the arms 1312, 1314, 1316, 1318 is compacted by end folding. A coaxial structure includes a center conductor 1302 and an outer shield 1304, which can correspond to the center conductor 602 and the outer shield 604 described earlier in connection with FIG. 6. A first arm 1312, a second arm 1314, a third arm 1316, and a fourth arm 1318 have the same effective electrical length as the first arm 612, the second arm 614, the third arm 616, and the fourth arm 618, respectively, of the embodiment described earlier in connection with FIG. 6, but the arms 1312, 1314, 1316, 1318 are physically shorter. A mirror image of the antenna is also applicable. The antenna of FIG. 13A is drawn for illustrative purposes only and is not necessarily to scale. While illustrated with each of the arms end folded, in other embodiments, one, two, or three of the arms are compacted by end folding, and the other arms are either not compacted or are compacted with a different technique. Accordingly, a miniaturized arm can correspond to at least one of a bent arm, a folded arm, a capacitive end loaded arm, a meander pattern loaded arm, or an inductively loaded arm.

Figure 13B:
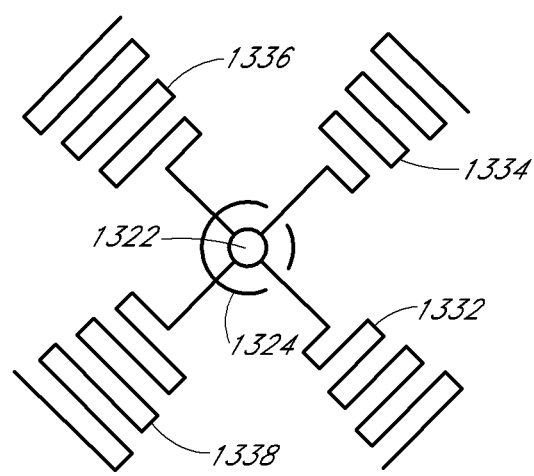
FIG. 13B illustrates a top-view of a cross-dipole antenna according to an embodiment of the invention in which each of the arms is compacted by a meander pattern.

FIG. 13B illustrates a top-view of a cross-dipole antenna according to an embodiment of the invention in which each of the arms 1332, 1334, 1336, 1338 is compacted by meandering. A coaxial structure includes a center conductor 1322 and an outer shield 1324, which can correspond to the center conductor 602 and the outer shield 604 described earlier in connection with FIG. 6. A first arm 1332, a second arm 1334, a third arm 1336, and a fourth arm 1338 have the same effective electrical length as the first arm 612, the second arm 614, the third arm 616, and the fourth arm 618, respectively, of the embodiment described earlier in connection with FIG. 6, but the arms 1332, 1334, 1336, 1338 are physically shorter. A mirror image of the antenna is also applicable. The antenna of FIG. 13B is drawn for illustrative purposes only and is not necessarily to scale. While illustrated with each of the arms meandered, in other embodiments, one, two, or three of the arms are compacted by meandering, and the other arms are either not compacted or are compacted with a different technique. A meander pattern can also include a stub for impedance matching.

Figure 14A:
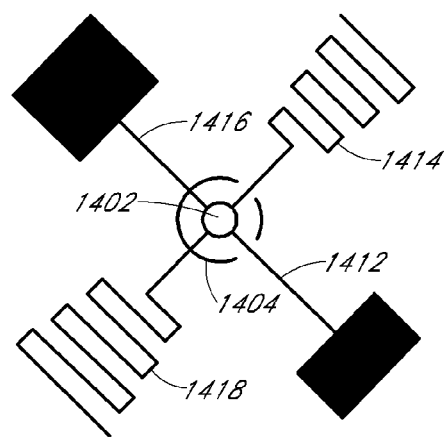
FIG. 14A illustrates a top-view of a cross-dipole antenna according to an embodiment of the invention in which two of the arms are compacted by capacitive end loading, and two of the arms are compacted by a meander pattern.

FIG. 14A illustrates a top-view of a cross-dipole antenna according to an embodiment of the invention in which two of the arms 1412, 1416 are compacted by capacitive end loading, and two of the arms 1414, 1418 are compacted by a meander pattern. A coaxial structure includes a center conductor 1402 and an outer shield 1404, which can correspond to the center conductor 602 and the outer shield 604 described earlier in connection with FIG. 6. A first arm 1412, a second arm 1414, a third arm 1416, and a fourth arm 1418 have the same effective electrical length as the first arm 612, the second arm 614, the third arm 616, and the fourth arm 618, respectively, of the embodiment described earlier in connection with FIG. 6, but the arms 1412, 1414, 1416, 1418 are physically shorter. A mirror image of the antenna is also applicable. The antenna of FIG. 14A is drawn for illustrative purposes only and is not necessarily to scale. Of course, other combinations are possible.

Figure 14B:
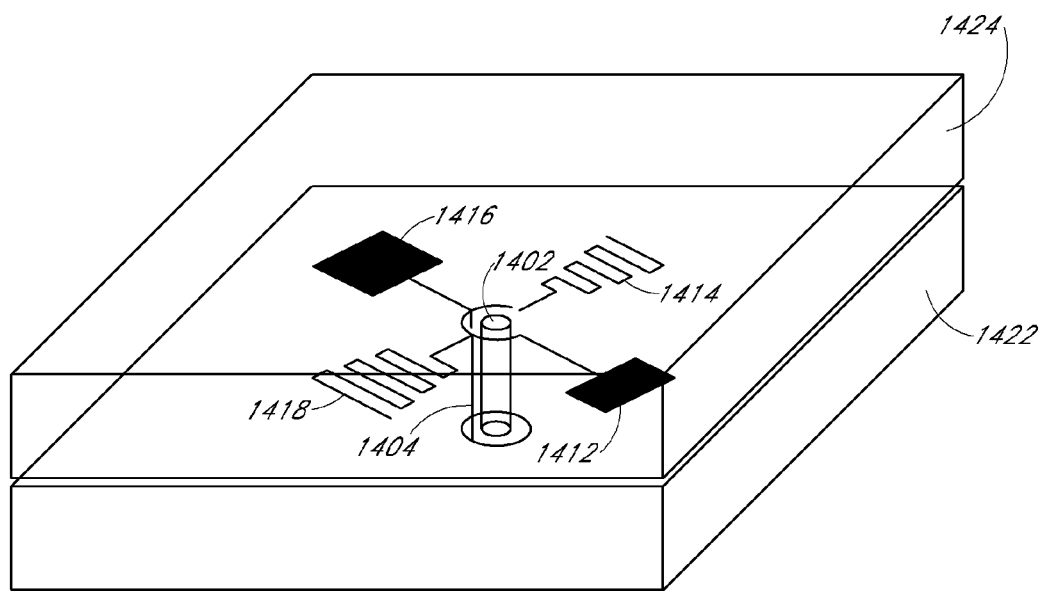
FIG. 14B illustrates a perspective view of the cross-dipole antenna depicted in FIG. 14A, wherein the cross-dipole antenna is sandwiched in dielectric blocks to form a chip antenna.

FIG. 14B illustrates a perspective view of the cross-dipole antenna depicted in FIG. 14A. In addition, the arms of the antenna are encased in a material having a high relative permittivity $\in_r$ and/or high relative permeability $\mu_r$. The characteristics of high relative permittivity $\in_r$, high relative permeability $\mu_r$, or both can further shrink the physical size of the antenna while maintaining a larger effective electrical length for the arms.

The arms of an antenna can be encased in a material having a high relative permittivity $\in_r$ and/or high relative permeability $\mu_r$ for packaging or miniaturization. The relative permittivity and the relative permeability of free space is 1. In one embodiment, high relative permittivity includes values for relative permittivity of at least 1.1. In one embodiment, high relative permeability includes values for relative permeability of at least 1.1. When desired for miniaturization or for packaging, the encasing of the arms in a material with either or both a high relative permittivity $\in_r$ characteristic and/or high relative permeability $\mu_r$ characteristic can be applied to both otherwise full-size antennas and to antennas utilizing one or more of the loading techniques described earlier in connection with FIGS. 12B-12G.

Figure 15:
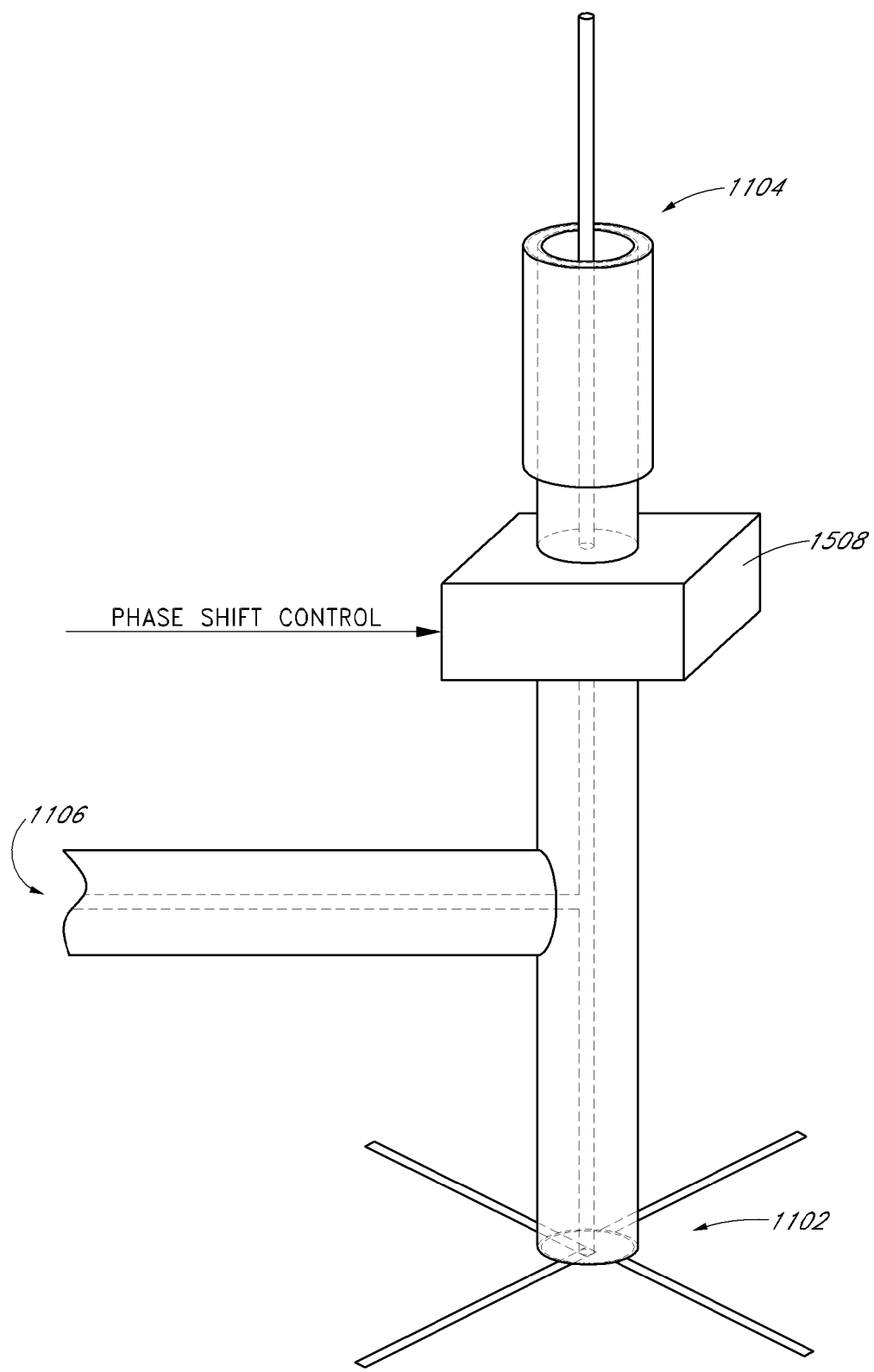
FIG. 15 illustrates another example of polarization diversity using a cross-dipole antenna combined with a monopole antenna in a "tee."

FIG. 15 illustrates the example of FIG. 11 with a variable shifter 1508 drawn. In the illustrated embodiment, the variable phase shifter 1508 is inserted between the tee and the monopole antenna 1104. For example, a controller or microprocessor of a wireless access point can control the phase shifting of the variable phase shifter as indicated by the input "phase shift control." The phase shifting frequency can be predetermined to a particular frequency, such as, but not limited to, several thousand Hertz, or can be adaptively adjusted in response to varying Doppler frequencies encountered.

Returning now to FIG. 6, in another embodiment, the first arm 612 and the third arm 616 form a first dipole. The second arm 614 and the fourth arm 618 form a second dipole. In a conventional cross-dipole antenna, the first arm 612 and the third arm 616 each have the same length, and each is shorter than a quarter of a wavelength for the intended frequency band. Also, in a conventional cross-dipole antenna, the second arm 614 and the fourth arm 618 have the same length, and each is longer than a quarter of a wavelength for the intended frequency band (notwithstanding use of some miniaturization technique). According to an embodiment of the invention, the arm lengths of dipoles of the cross-dipole antenna can vary as described below in connection with Table IV.

TABLE IV

| arm | connection | relative angle | arm length |
| --- | --- | --- | --- |
| first arm 612 | center | 0° | $a\lambda - y_1 R$ |
| second arm 614 | center | 90° | $b\lambda - y_2 R$ |
| third arm 616 | shield | 180° | $a\lambda + y_3 R$ |
| fourth arm 618 | shield | 270° | $b\lambda + y_4 R$ |

In one embodiment, four adjustment factors $y_1$, $y_2$, $y_3$, and $y_4$ do not need to be identical, and preferably, all four arms are optimized for performance. In the configuration described earlier in connection with Table III, the example yields the pattern illustrated in FIG. 8, advantageously exhibiting relatively good phase quadrature with relatively equal amplitudes. By contrast, the configuration of Table II yields the pattern illustrated in FIG. 9. Returning now to the configuration described earlier in Table IV, the lengthening of the outer shield-connected arms 616, 618 by adjustment factors $y_3$ and $y_4$ is accompanied by some shortening by adjustment factors $y_1$ and $y_2$ of the inner conductor connected arms 612, 614.

Table V, below, summarizes the connections, the relative angles, and the arm lengths for another embodiment of the antenna. The lengths of each arm are described from the center of the coaxial feedline to a distal end, wherein a proximal end of each arm is connected to either the center conductor or to the outer shield, as appropriate. In contrast to the conventional art, the arm lengths of each dipole are not the same. In the illustrated embodiment, the first arm 612 and the second arm 614 (FIG. 6) are shorter than the corresponding arms 312, 314 (FIG. 3) of the conventional art, and the third arm 616 and the fourth arm 618 are longer than the corresponding arms 316, 318 (FIG. 3) of the conventional art. In Table V, the factor a corresponds to the fraction used for the shorter arms of the conventional cross-dipole antenna. The factor b corresponds to the fraction used for the longer arms of the conventional cross-dipole antenna. In one embodiment, a skilled practitioner uses 0.25 as a starting point for factor a and for factor b. Then by reducing a to make the corresponding arms more capacitive and lengthening b to make the corresponding arms more inductive, the phase of the current is advanced and retarded, respectively. When each phase has been changed by 45 degrees, the desired quadrature phase relationships among the arms is established. Vector voltmeters, network analyzers, and simulation models are typically employed to generate the desired lengths corresponding to factor a and factor b. Applicant has recognized that the radius R (half the diameter) of the outer conductor of the corresponding coaxial structure, such as coaxial cable, impacts the arm length for those arms connected to the outer conductor. The distorting effect on the antenna pattern caused by the outer conductor becomes more acute as the coaxial structure outer diameter becomes larger relative to the length of the arms. As frequencies go up, the arm lengths decrease. In addition, since larger diameter coaxial structures have less loss at high frequencies, it is desirable to use larger diameter coaxial structures as frequency goes up. In one embodiment, disclosed techniques provide a noticeable benefit to antenna pattern above 1 GHz. See for example, the pattern of FIG. 9. By contrast, according to prior art techniques, the "kidney bean" shaped pattern of FIG. 8 was not correctable. In one embodiment, the illustrated techniques are applicable when the radius of the outer shield of the coaxial structure is at least one-fiftieth (1/50) of the shortest of the arms 612, 614, 616, 618 or at least one-thirtieth (1/30) of the shortest of the arms 612, 614, 616, 618.

The constant R represents the radius of the outer shield 604 of the coaxial structure. The factors $y_1$, $y_2$, $y_3$, and $y_4$ corresponds to a fraction, preferably about 0.6, which is multiplied by the radius R and added to the lengths of the third arm 616 and the fourth arm 618. However, the factors $y_1$, $y_2$, $y_3$, and $y_4$ can vary in a relatively broad range. For example, $y_1$, $y_2$, $y_3$, and $y_4$ can vary between about 0.54 to about 0.66. In another example, $y_1$, $y_2$, $y_3$, and $y_4$ can vary between about 0.48 to about 0.72. In another example, $y_1$, $y_2$, $y_3$, and $y_4$ can vary between about 0.42 to about 0.78. In another example, $y_1$, $y_2$, $y_3$, and $y_4$ can vary between about 0.3 to about 1.2. In another example, $y_1$, $y_2$, $y_3$, and $y_4$ can vary between about 0.15 to about 1.15. Other applicable values for $y_1$, $y_2$, $y_3$, and $y_4$ will be readily determined by one of ordinary skill in the art.

Table IV illustrates an example of dimensions for an embodiment of an antenna suitable for operation at about 9.4 GHz, wherein the antenna has fan-shaped arms fabricated using copper traces on a printed circuit (PC) board. Such fan-shaping of the arms as well as the dielectric of the PC board has a subtle miniaturization effect, and as a result, the arm lengths of the illustrated embodiment are each shorter than a quarter of a free-space wavelength. For example, the spreading of the arm at a distal end has an effect similar to the capacitive end loaded arm described earlier in connection with FIG. 12D. These lengths are as measured from the center of the coaxial structure. In addition, the simulation models included a 0.1 inch diameter coaxial cable feedline.

TABLE V

| arm | connection | adj. | adj./R | adj. (inches) | arm length | relative adj./R |
|---|---|---|---|---|---|---|
| first arm 612 | center | $-y_1R$ | −0.2 | −0.01 | 0.215 inches | n/a |
| second arm 614 | center | $-y_2R$ | −0.3 | −0.015 | 0.250 inches | n/a |
| third arm 616 | shield | $y_3R$ | 0.2 | +.01 | 0.235 inches | $x = y_1 + y_3 = 0.4$ |
| fourth arm 618 | shield | $y_4R$ | 0.3 | +0.015 | 0.280 inches | $x = y_2 + y_4 = 0.6$ |

In Table V, the column "arm" describes the particular arm, the column "connection" describes the connection for the arm, the column "adj" corresponds to the adjustment for the arm as described earlier in connection with Table IV. The column "adj./R" illustrates the actual value for $y_1$, $y_2$, $y_3$, and $y_4$ as used in the example illustrated in Table III with a 0.1 inch diameter (0.05 inch radius) coaxial structure. The column "adj. (inches)" describes the adjustment in inches. The column "arm length" describes the overall arm length, and the "relative adj./R" describes the corresponding x value described earlier in connection with Table 1.

The arms 612, 614, 616, 618 of the antenna can be implemented with conductive traces (typically copper) on a printed circuit board. For example, the first arm 612 and the second arm 614 can be formed on a first side (for example, upper) of the circuit board, and the third arm 616 and the fourth arm 618 can be formed on a second side (for example, lower) of the circuit board. For example, the center conductor 602 can be soldered to electrically connect to the traces for the first arm 612 and the second arm 614, and the outer shield 604 can be soldered to connect to the traces for the third arm 616 and the fourth arm 618. In an alternative embodiment, the traces are formed on different layers of a circuit board, which are not necessarily on opposite sides of the circuit board. Of course, adapters and/or connectors can also be disposed between the coaxial structure and the arms 612, 614, 616, 618 of the antenna.

The cross dipole antenna described above can be used in a variety of applications, such as, but not limited to, base stations, wireless routers, wireless access points, wireless bridges, cellular telephone base stations, cellular telephones, wireless computers, portable or hand-held computers, a set top boxes for television, video gaming consoles, interactive kiosks, digital cameras, digital video cameras, digital music players, other electronic devices or combinations thereof. Another example of an application in which the cross dipole antenna can be used is in a femtocell.

Various embodiments have been described above. Although described with reference to these specific embodiments, the descriptions are intended to be illustrative and are not intended to be limiting. Various modifications and applications may occur to those skilled in the art.

What is claimed is:

1. A method for designing a cross-dipole antenna intended to be used for a signal having a wavelength $\lambda$, wherein the cross-dipole antenna comprises a first arm, a second arm, a third arm, and a fourth arm, the method comprising:

generating a simulation model of the cross-dipole antenna, wherein the simulation model includes the first arm, the second arm, the third arm, the fourth arm and a coaxial structure to which the first arm, the second arm, the third arm, and the fourth arm are connected;

simulating the cross-dipole antenna via computer execution of the simulation model; and adjusting arm lengths of one or more of the first arm, the second arm, the third arm, and the fourth arm in response to simulation results.

2. The method of claim 1, further comprising:

starting with a length $a\lambda$ for the first arm and the third arm, wherein a value for a is about 0.5, wherein the first arm is connected to a center conductor of the coaxial structure and the third arm is connected to a shield of the coaxial structure;

starting with a length $b\lambda$ for the second arm and the fourth arm, wherein a value for b is about 0.5, wherein the second arm is connected to a center conductor of the coaxial structure and the fourth arm is connected to a shield of the coaxial structure;

adjusting the value for a of the shorter arms and adjusting the value for b of the longer arms until a quadrature phase relationship is established among the arms, wherein a final value for a of the shorter arms is less than a final value for b of the longer arms, wherein the quadrature phase relationship is determined via computer execution of the simulation model;

increasing a length of the third arm relative to the first arm by a fraction x of a radius R of the coaxial structure; and increasing a length of the fourth arm relative to the second arm by the fraction x of the radius R of the coaxial structure.

3. The method of claim 2, wherein a value for x is between about 0.3 to about 1.2.

4. The method of claim 2, wherein a value for x is between about 0.42 to about 0.78.

5. The method of claim 2, wherein a value for x is between about 0.48 to about 0.72.

6. The method of claim 2, wherein a value for x is between about 0.54 to about 0.66.

* * * * *